(12) United States Patent
Lautzenhiser et al.

(10) Patent No.: US 6,743,534 B2
(45) Date of Patent: Jun. 1, 2004

(54) SELF-CONSTRAINED LOW TEMPERATURE GLASS-CERAMIC UNFIRED TAPE FOR MICROELECTRONICS AND METHODS FOR MAKING AND USING THE SAME

(75) Inventors: Frans P. Lautzenhiser, Collegeville, PA (US); Edmar M. Amaya, King of Prussia, PA (US); J. Thomas Hochheimer, Downingtown, PA (US)

(73) Assignee: Heraeus Incorporated, West Conshohocken, PA (US)

( * ) Notice: Subject to any disclaimer, the term of this patent is extended or adjusted under 35 U.S.C. 154(b) by 0 days.

(21) Appl. No.: 10/262,362

(22) Filed: Oct. 1, 2002

(65) Prior Publication Data

US 2003/0087136 A1 May 8, 2003

Related U.S. Application Data

(60) Provisional application No. 60/326,350, filed on Oct. 1, 2001, and provisional application No. 60/362,656, filed on Mar. 8, 2002.

(51) Int. Cl.[7] .............................. B32B 9/00; B32B 18/00
(52) U.S. Cl. ....................... 428/701; 428/209; 428/210; 428/702
(58) Field of Search ................................ 428/209, 701, 428/210; 438/453

(56) References Cited

U.S. PATENT DOCUMENTS

| | | |
|---|---|---|
| 4,340,436 A | 7/1982 | Dubetsky et al. |
| 4,521,449 A | 6/1985 | Arnold et al. |
| 4,536,535 A | 8/1985 | Usala |
| 4,654,095 A | 3/1987 | Steinberg |
| 4,769,294 A | 9/1988 | Barringer et al. |
| 5,085,720 A | 2/1992 | Mikeska et al. |
| 5,102,720 A | 4/1992 | Raj |
| 5,130,067 A | 7/1992 | Flaitz et al. |

(List continued on next page.)

FOREIGN PATENT DOCUMENTS

| | | |
|---|---|---|
| EP | 0 243 858 A2 | 11/1987 |
| EP | 0 276 004 A2 | 7/1988 |
| EP | 0 519 676 A2 | 12/1992 |
| EP | 0 934 910 A2 | 8/1999 |
| EP | 0 983 843 A2 | 3/2000 |
| EP | 1 033 749 A2 | 9/2000 |

OTHER PUBLICATIONS

Excerpt from Ragan Technologies, Inc., "ZST™—LTCC In–House/Green Tape Production", web site http://www.ragantech.com/CIA.html, Jan. 22, 2002.

Excerpt from SMI–ED Ogaki Ceramics, Inc., "Low Temperature Fireable Ceramics", web site http://www.smiedoc.co.jp/elfc01.html, Jan. 22, 2002.

Primary Examiner—Deborah Jones
Assistant Examiner—G. A. Blackwell-Rudasill
(74) Attorney, Agent, or Firm—Akin Gump Strauss Hauer & Feld, LLP

(57) ABSTRACT

A monolithic self-constrained green body tape for use in low temperature ceramic co-firing is provided. The tape contains at least two layers: one low temperature ceramic layer containing particles of a glass, a ceramic, and an organic binder, and a self-constraining layer containing a refractory ceramic and a wetting agent for the glass in the first layer. When the tape is fired at a sintering temperature of the low temperature ceramic layer, densification occurs in the z (thickness) direction, but essentially no shrinkage (less than about 1%) occurs in the x-y planes. A method for forming a multilayer green body tape using simultaneous wet on wet ceramic slurry deposition is also provided. A dense, monolithic, low temperature, co-fired, self-constrained, multicomponent structure is also provided. The structure contains at least two multilayer ceramic substrates having electronic circuit components mounted thereon or therein. Each multilayer ceramic substrate contains at least two layers with one being a self-constraining layer.

25 Claims, 3 Drawing Sheets

U.S. PATENT DOCUMENTS

| | | | |
|---|---|---|---|
| 5,164,342 A | 11/1992 | Muralidhar et al. | |
| 5,254,191 A | 10/1993 | Mikeska et al. | |
| 5,277,724 A | 1/1994 | Prabhu | |
| 5,312,674 A | 5/1994 | Haertling et al. | |
| 5,370,759 A | 12/1994 | Hakotani et al. | |
| 5,383,474 A | 1/1995 | Akhter et al. | |
| 5,387,474 A | 2/1995 | Mikeska et al. | |
| 5,474,741 A | 12/1995 | Mikeska et al. | |
| 5,518,969 A | 5/1996 | Ragan | |
| 5,683,790 A | 11/1997 | Suzuki et al. | |
| 5,708,570 A | 1/1998 | Polinski, Sr. | |
| 5,744,232 A | 4/1998 | Bailey et al. | |
| 5,769,917 A * | 6/1998 | Belko et al. | 65/17.3 |
| 5,780,375 A | 7/1998 | Drozdyk | |
| 5,821,181 A | 10/1998 | Bethke et al. | |
| 5,866,240 A | 2/1999 | Prabhu et al. | |
| 5,990,028 A | 11/1999 | Roethlingshoefer et al. | |
| 6,117,367 A | 9/2000 | Bezama et al. | |
| 6,139,666 A | 10/2000 | Fasano et al. | |
| 6,147,019 A | 11/2000 | Donohue | |
| 6,205,032 B1 | 3/2001 | Shepherd | |
| 6,217,821 B1 | 4/2001 | Donohue | |
| 6,320,547 B1 | 11/2001 | Fathy et al. | |
| 6,406,791 B1 | 6/2002 | Dai et al. | |
| 6,432,239 B1 | 8/2002 | Mandai et al. | |
| 6,468,640 B2 * | 10/2002 | Nishide et al. | 428/210 |
| 2001/0018797 A1 | 9/2001 | Shepherd | |
| 2002/0061629 A1 | 5/2002 | Nishide et al. | |
| 2003/0234072 A1 | 12/2003 | Wang et al. | |

\* cited by examiner

SELF-CONSTRAINED LOW TEMPERATURE GLASS-CERAMIC UNFIRED TAPE FOR MICROELECTRONICS AND METHODS FOR MAKING AND USING THE SAME

CROSS-REFERENCE TO RELATED APPLICATIONS

This application claims the benefit of U.S. Provisional Applications Nos. 60/326,350, filed Oct. 1, 2001, and 60/362,656, filed Mar. 8, 2002.

BACKGROUND OF THE INVENTION

The co-sintering or firing of laminated ceramic tapes is a well-known module manufacturing method in the microelectronics industry. The term "low-temperature co-fired ceramic (LTCC)" refers to a technology for forming multilayered ceramic circuits. In this approach, a tape is formed from glass and ceramic powders uniformly dispersed in an organic binder. Typically, two or more layers of this tape are laminated together to form a circuit. To form electrical connections from one layer of tape to the next, via holes are punched through the tape and filled with a thick-film conductor paste, for example as described in U.S. Pat. No. 4,654,095 of Steinberg.

In the next step, thick-film pastes (dispersions of metallic, ceramic or glass powders in volatilizable organic vehicles) that will form components of electronic circuits, such as conductors or resistors, are then screen-printed onto the tape. After all of the layers of tape necessary to form the completed circuit have been prepared, the pieces of tape are aligned to ensure that the via connections from one layer will make contact with conductor traces or via holes on the next. The layers of tape are then laminated with a combination of heat and pressure to form a single green body, i.e., a structure that is held together by organic binders, such as polyvinyl butyral or acrylate materials.

In order to form the final ceramic body, the green body is fired in a firing profile that typically reaches a peak temperature of about 850° C. to 900° C. before returning to ambient temperature. In a range of temperatures between about 350° C. and 450° C., the organic binders that give the green body strength are volatilized or burned out. To give the volatilized gases sufficient time to escape, the ramp rate (change in temperature per unit time) of the profile is often reduced in this temperature range.

Above the burnout temperature, the ramp rate of the firing profile is increased and the part is heated until reaching the peak firing temperature. The LTCC tape typically contains a significant amount of a glass with which a glass softening point $T_g$ is associated. The glass and ceramic powders will begin to sinter into a dense body when the temperature is above the softening point of the LTCC glass, so the peak firing temperature of the tape is typically 100° C. to 200° C. above the $T_g$. The thick-film conductor and resistor materials used in the circuit body will undergo a similar metamorphosis from organically bound powders into dense sintered structures. After allowing the parts to remain at the peak firing time to reach an adequately dense body, the parts are cooled to room temperature.

Manufacturing of LTCC tapes is typically performed using tape casting techniques, such as those described in U.S. Pat. No. 5,821,181 of Ursula, et al. In this method, ceramic slurry (a mixture of the inorganic and organic components of the tape before drying) is deposited on top of a polyester film or carrier using a doctor blade. One disadvantage of using tape casting techniques for tape manufacturing is the difficulty of thickness control as the tape becomes thinner and thinner. More specifically, thickness, accuracy and variance become uncertain when casting under 2 mils (50 microns), a measurement which refers to the gap between the blade and the backing as the wet slurry passes through. Therefore, control of the layer thickness, especially of inner layers, becomes difficult and often inaccurate.

While accurate casting of individual layers is achievable, the method described in U.S. Pat. No. 5,102,720 for drying the tapes individually and subsequently laminating them together is uneconomical. Thus, methods which involve drying individual layers and lamination with heat and pressure, or casting a subsequent layer on top of a dry layer, not only introduce significant costs to the manufacturing process, but also limit product yields.

Other manufacturing methods include dipping a moving carrier film in a slurry to create a meniscus between the carrier film and the slurry. However, the meniscus created by capillary forces between the wet organic binder and the film causes it to stick to the surface of the polyester film. As in other methods, drying one layer at a time and then casting a wet layer on top of a dry layer or subsequent heat lamination are needed. Because of the disadvantages with known methods for manufacturing LTCC tapes, there remains a need in the art for an improved, economical method for fabricating LTCC tapes which will maximize product yield and permit tight control of layer thickness.

The LTCC technology has advanced beyond the microelectronic circuit industry and is currently in use for a variety of applications. One important attribute of LTCC is the ability to create three-dimensional structures using multiple layers of tape. The bio-medical device industry, for example, uses LTCC for the manufacturing of cavities and channels for moving part pumps used in in-situ drug delivery systems. Biological test modules have been realized which facilitate the automatic testing of biological and chemical materials.

In the telecommunications industry, there is a need for integrated opto-electronic modules. LTCC offers the simplicity of being able to co-sinter optical fibers together with the driving electronics. The co-firing of meso-scale structures containing metallization, cavities, vias, and channels is thus an appealing feature of LTCC.

LTCC meso-systems are small packages capable of handling at least two media, such as electricity and fluids, by means of sensors, actuators, interconnection, control and/or signal processing. Miniaturization is one of the biggest drivers of this technology, thus allowing systems in package (SIP), in which several components are inserted into a monolith.

An attractive feature of LTCC tapes is the possibility for making cavities for the placement of integrated circuits within. For example, as shown in FIG. 1A, a single electronic module 15 contains a cavity 15A, a metallic via 15B, and a metallic line trace 15C on the surface of the ceramic monolith. FIG. 1B shows a panel area 17 which contains an array of microelectronic modules 15. The panel 17 is typically formed and processed as a whole and then cut into individual modules 15.

Cavities allow a module to retain a low profile, while a lid may be placed on top for hermeticity. However, during surface or sacrificial constrained sintering, as explained below, the cavity walls exhibit a phenomenon called necking, a vertical curvature from the top surface interface to the bottom of the fired substrate surface. During sintering of sacrificially constrained structures, there is a stress distribution due to the shear and in-plane tensile stresses from top to bottom. It has been shown that stresses are significantly higher at the constrained interface. Moving along the z-axis towards the middle of the fired substrate, there are fewer constraining forces that counteract the in-plane tensile stresses. Therefore, there is significantly more densification in the middle of the monolith, which causes the vertical curvature. Furthermore, as a consequence of the higher stress distribution at the interface, delamination or buckling is usually present. The aforementioned properties are undesirable, especially when constructing cavities or other precision features in the ceramic structures.

Despite the numerous applications of LTCC technology, the LTCC process has several disadvantages. First, there are significant changes in the dimensions of the ceramic monolithic structure during sintering. More specifically, when the constituent powders of the LTCC structure densify during traditional unconstrained or free sintering, shrinkage occurs in all dimensions. Typically, the shrinkage of the tape across its width or length (the x- or y-directions) will be nearly identical and only slightly different from the shrinkage through the thickness of stack-up of tape layers (the z-direction). Usually, the dimensions of the structure after firing will be about 84% to 87% of the size in the unfired green state. This change and the associated variations result in several disadvantages to the use of conventional LTCC technology.

First, the shrinkage in the x-y directions, $S_{xy}$, requires that the area of green tape used to make an unconstrained circuit be a factor of $1/(1-S_{xy})^2$ greater than the ultimate fired area. Consequently, the green tape area used to make a free sintered circuit should be about 25% to 40% larger than the final circuit.

A second disadvantage of unconstrained sintering is the loss of geometric precision that occurs in free sintered circuits. This loss of precision limits the ability to produce large numbers of microelectronic single parts or individual modules in a single LTCC panel size, the size of a large array of modules built in a single LTCC substrate. Specifically, this size is limited because of the shrinkage in the planar (x and y) directions, usually 10–15%, and its variation, typically about ±0.2% to ±0.4%. This variation becomes increasingly problematic as the size of the LTCC circuit or the devices which will be placed on the circuit increases, or as the interconnect pitch (the space between connections on a package) decreases. For example, if the dimensions of a panel size are 8 in×8 in (203 mm×203 mm), such a variation would result in a positional uncertainty of about ±16 mils (41 µm).

During firing, the shrinkage uncertainty of the LTCC causes the external features to vary with respect to the intended nominal position. Artworks used for post-firing processes, such as the printing of post-fired conductors or resistors, or for printing solder on conductors, are based on the intended nominal position. Excessive distance between the actual fired position of a circuit feature and the nominal position can cause circuit failures if, for example, there is failure to make adequate electrical contact, which may result from lack of via connections or misalignments between layers due to shrinkage uncertainty. Alternatively, although artwork features may be enlarged to allow for such shrinkage variation, decreased circuit density may result.

The aforementioned problems, which limit the ability to co-fire embedded components and/or to create distortion-free cavities within a ceramic monolith, have driven the microelectronics industry to resort to constraining practices in order to reduce the dimensional uncertainty of ceramic panels during the firing process. A variety of such constraining methods have been used in the industry to try to adapt and circumvent the shrinkage problem.

For example, pressure-assisted sintering and the application of external loads on top of ceramic tape modules are described in U.S. Pat. No. 4,340,436. The use of mechanical clamping on the periphery of a ceramic panel to contain its x-y dimensions is discussed in European Patent No. 0 243 858.

These types of approaches present several potential problems and disadvantages to the manufacturer. Because the presence of the platen may cause functional defects in any conductors or resistors which are in direct contact with the surface of the LTCC, the platen contact geometry must be carefully controlled and aligned with the green tape. Use of mechanical clamping techniques may require different platen designs for different circuits. Finally, a separate platen must be used for each constrained structure being fired in a batch.

Alternatively, the use of porous contact sheets attached to the LTCC panels that are easily removed after sintering is described in U.S. Pat. No. 6,139,666. Additionally, as described in U.S. Pat. No. 6,205,032 and U.S. Patent Application Publication No. 2001/0018797, the use of a constraining ceramic core that constrains the attached layers using subsequent firings has been attempted.

A further technique for constraining the x-y geometry of LTCC circuits involves laminating sacrificial constraining tape layers onto the top and bottom surfaces of the LTCC circuit body. This technique has been described, for example, in U.S. Pat. Nos. 5,085,720; 5,254,191; 5,383,474; and 5,474,741, all of Mikeska, et al. The sacrificial tape layers are formed from porous, high temperature refractory ceramic powder that by itself will not sinter during the LTCC firing process. Since the sacrificial tape does not sinter and densify during the firing profile, it maintains the geometry of its green state.

However, in order for the sacrificial refractory tape to constrain the x-y geometry of underlying LTCC tape, at least two conditions should be met. First, there must be sufficient friction between the two tape materials to mechanically link the materials. Second, glassy components of the LTCC tape that could dissolve the refractory component of the sacrificial tape during the LTCC firing profile, thus allowing it to sinter and densify, must not saturate the sacrificial tape layer.

All of the aforementioned external constraint approaches have significant drawbacks. For example, pressure-assisted sintering and peripheral constraining require special adaptation of the furnace or the need for external equipment to mechanically prevent shrinkage of the ceramics. Other methods require the creation of refractory ceramic porous molds to form the tape for cavities.

Finally, several potential problems exist for manufacturers using sacrificial tape processes. After firing, the sacrificial tape layer must be removed from the circuit body sufficiently completely to not interfere with subsequent manufacturing processes, but not so aggressively as to damage the remaining LTCC body. Like the platen of the mechanical clamping technique, the sacrificial tape may be incompatible with conductors or resistors that may be placed on the surface of the LTCC circuit body. Therefore, these surface features must be printed and fired after removal of the sacrificial layer, which increases the number of processing steps on the manufacturing line and also results in increased cost of successive firings (furnace costs). From the standpoint of process yield and process simplicity, it would have been preferable to print these features on green tape and co-fire them with the rest of the circuit body. Further, because the sacrificial tape has virtually no mechanical strength after firing, it cannot be incorporated into the body of the LTCC circuit. This limits the thickness of bodies that can be constrained with this method, as the degree of constraint deteriorates with an increase in the distance from the constraining layer. Finally, contact sheets of refractory ceramic sacrificial tape have the potential for surface contamination of the LTCC tape, and the removal or dusting and waste of the sacrificial layer contribute to and reflect on the individual module cost.

There remains a need in the art for a method of constrained sintering for low temperature co-fired ceramic that does not have the drawbacks and limitations of currently employed methods. Such a technology must ensure that x-y dimensions established during via punching and printing are maintained during firing. Additionally, the method should reduce dimensional uncertainty in ceramic parts and eliminate many of the circuit development and manufacturing steps necessary to avoid dimensional errors and misregistration.

BRIEF SUMMARY OF THE INVENTION

A monolithic green body tape having an x-y plane and a thickness in a z-direction for use in low temperature ceramic co-firing is provided. The tape comprises at least one low temperature ceramic layer containing particles of a first ceramic, a first glass, and a first organic binder; and at least one self-constraining layer containing particles of a refractory ceramic, a wetting agent for the first glass, and a second organic binder. The refractory ceramic will not sinter at a sintering temperature of the low temperature ceramic layer, such that upon firing of the green body tape at the sintering temperature of the low temperature ceramic layer, the layers densify in the z direction but shrinkage in the x-y plane is less than about 1%, without application of an external constraint.

A dense, monolithic, low temperature co-fired, self-constrained, multicomponent structure comprising a stack of at least two multilayer ceramic substrates, particularly the above-monolithic green body tapes, each having at least one electronic circuit component mounted thereon or therein is provided. Each substrate comprises at least one low temperature ceramic layer containing sintered particles of a first ceramic and a first glass, and at least one self-constraining layer containing particles of a refractory ceramic and a wetting agent for the first glass. The refractory ceramic and the wetting agent are at least partially fused with the first glass.

A method of fabricating a monolithic, multilayer green body tape is also provided. The method comprises the steps of:

(a) forming a first slurry comprising particles of a first ceramic, a first glass, a first organic binder, and a first solvent;

(b) forming a second slurry comprising particles of a refractory ceramic, a second organic binder, and a second solvent;

(c) depositing a first layer of one of the first and second slurries though a slot-die onto a carrier;

(d) depositing a second layer of the other of the first and second slurries through a slot-die onto the one of the slurries while the one slurry is still in a wet condition on the carrier but such that the first and second layers remain substantially discrete; and (e) drying the deposited slurries to substantially remove the solvents but not the binders.

Finally, in a method for producing a fired monolithic structure for a multilayer electronic circuit or hydraulic module which method comprises the steps of providing green body ceramic tapes each having an x-y plane, applying electronic circuit components to the tapes, stacking the tapes in a z-direction, laminating the stacked tapes, heating the laminate of stacked tapes to remove organic binder from the tapes, and co-firing the binderless laminate to produce the monolithic structure with shrinkage substantially only in the z-direction and substantially no shrinkage in the x-y planes, an improvement is provided: the step of providing the green body ceramic tape comprises providing at least one tape with a self-constraining layer, and the step of co-firing is carried out without application of an external constraint.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1A:
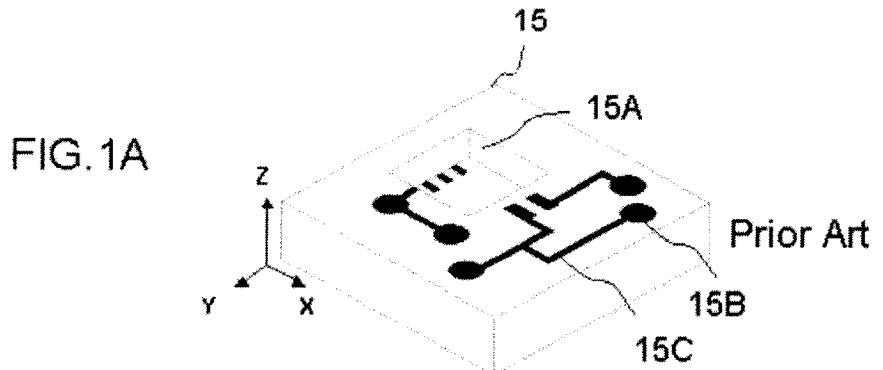
FIG. 1A is a schematic perspective view of a typical single module featuring a cavity, top printed metal conductors and vias.
Figure 1B:
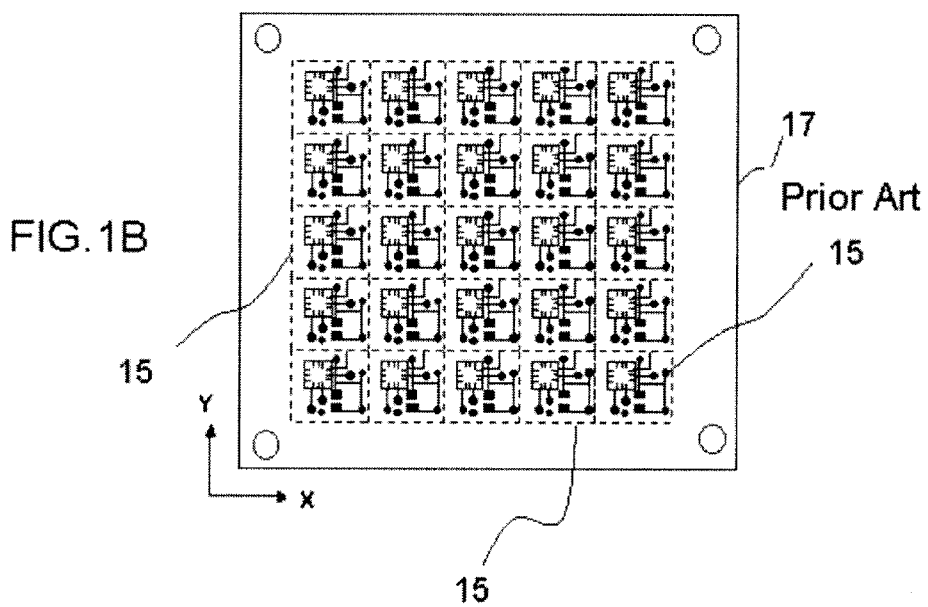
FIG. 1B is a schematic plan view of a panel incorporating several multilayer microelectronics modules of FIG. 1A.

As previously explained, the electronic module industry has not yet found a way to address the shrinkage issue in an economical and trouble-free way. An ideal solution would be a single non-shrink ceramic tape material that would process like regular LTCC tape in processing steps such as stacking, laminating, printing and via filling. The advantage would be greater yet if the tape were to co-fire or sinter simultaneously with metallization at standard LTCC temperatures. Further, a single tape versatile enough to address issues such as low dielectric loss at high frequencies and the integration of passive and active components, while eliminating dimensional uncertainty as the panel size increases, would also be desirable.

The present invention accomplishes these objectives. Specifically, a monolithic green body tape is provided which may be used for the construction of multilayered ceramic structures that contain embedded conductor patterns for microelectronic applications. As will be described in more detail below, this green body tape processes like traditional single layer LTCC tape, yet maintains its geometrical x-y dimensions after firing due to the fact that the tape itself is self-constrained, thereby alleviating several problems facing currently practiced externally constrained sintering manufacturing techniques. For example, the self-constrained green body tape according to the invention allows for improved planarity of the resulting structures formed therefrom, and may be used in the construction of ceramic multilayer circuits and individual modules composed of conventional thick film metallizations, including surface conductors, surface resistors, surface dielectric masks, imbedded passive/active components and cavities within. The improved tape according to the present invention also enhances the properties of the metal conductive patterns printed therein or thereon, including solderability, adhesion, conductivity, and resistivity.

Green Body Tape

The monolithic green body tape for use in low temperature co-firing may be referred to as "self-constrained" because, as will be explained in further detail below, essentially no shrinkage of the tape occurs in the x-y direction upon sintering, yet no constraint is needed to achieve this objective. The tape comprises at least two layers. The first layer is a low temperature ceramic layer which contains particles of a first ceramic, a first glass, and a first organic binder. The ceramic and the glass which comprise the low temperature ceramic layer may together be referred to as the "inorganic composition" of the low temperature ceramic layer, which composition may be determined by the ultimate application of the green body tape. The inorganic composition of the first layer may be that of a traditional LTCC tape known to those skilled in the art, an LTCC tape composition modified for a particular application, or a novel composition. The first layer will therefore also be referred to herein as a "low temperature ceramic" or "LTCC" layer.

Glass

The particular glass for use in the low temperature ceramic layer may be selected based on the desired application of the green body tape. Glass is an amorphous material comprising elemental oxides, the nature of which determine the physical properties of the glass, such as $T_g$ (glass transition temperature), viscosity, porosity, translucency, dielectric constant, and thermal coefficient of expansion (TCE). Such properties may be controlled depending on the particular application desired. For example, the glass, with appropriate heat treatment during firing, could devitrify, causing it to become crystalline in structure. The glass could also be engineered to react with the refractory components in the tape at firing temperatures, thus creating different crystalline phases with properties such as low loss at high frequencies. For other applications, the glass might be engineered to give a high permittivity for capacitor applications. The most important physical properties of the glass for use in the present invention are its viscosity and wetting angle, which may be modified by those skilled in the art by mixing several inorganic oxide combinations. Any type of glass known in the art may be used in the LTCC layer, such as, but not limited to a silicate glass, and more preferably a borosilicate glass, such as lead borosilicate, calcium borosilicate, or lithium borosilicate glass.

Ceramic

The second inorganic material in the LTCC layer is a ceramic, which has a higher melting temperature than the glass and which may be used as a complement to the glass. While some of the ceramic is intended to react with the glass, the ceramic may also serve as a filler. The ceramic may also have a specific purpose to affect the overall properties of the green body tape, such as strength, TCE, or coefficient of thermal frequency ($T_f$), i.e., the shift in frequency response upon a change in temperature. The ceramic may be one such as alumina, titania, or silica, for example, but many ceramics known in the art would be appropriate for inclusion in the low temperature ceramic layer.

Nucleating Agent

In a preferred embodiment, the inorganic composition of the LTCC layer further comprises a nucleating agent. A nucleating agent is usually a noble metal or transition metal oxide which is incorporated into the inorganic composition of the LTCC layer and which becomes an integral part of the glass structure upon sintering. The nucleating agent is used to speed the divitrification of glass to form desired crystalline phases during the firing process, to increase the volume density of the desired crystalline phase, or to control the grain size of the crystalline structure by causing more, smaller, crystalline grains to form. A preferred nucleating agent is titania, which may be included in the LTCC layer in an amount effective to minimize porosity between the LTCC layer and the self-constraining layer, as explained below. Other nucleating agents, such as zirconia, anorthite, molybdenum oxide, tungsten oxide, magnesium cobalt spinel, or their combinations, may also be included in the low temperature ceramic layer. The specific selection of nucleating agent may be dependent on the particular types of glass and ceramic present in the LTCC layer.

Without wishing to be bound by theory, it is believed that upon sintering the green body tape, as described below, the presence of a nucleating agent results in the formation of a new ceramic material in the LTCC layer which has a new crystalline structure. This new material causes the end product formed from the green body tape to exhibit superior dielectric properties. In one embodiment, the nucleating agent is titania, and anorthite is formed in the LTCC layer upon sintering. In the absence of a nucleating agent, the sintered material is glassier, rather than having a large volume density of the desired crystalline phase. This glassy material may not have the desired dielectric properties and tends to be weaker than crystalline phases. Furthermore, silver has far more mobility in glassy materials than in crystalline materials and this may have a harmful effect on the reliability of circuits formed from the green body tape using silver conductors. However, problems may also arise when the glass in the LTCC layer devitrifies too quickly or too completely. Specifically, because crystalline phases impede the flow of material during sintering, the early appearance of crystalline phases might prevent the sufficient flow of glass into the constraining layer and prevent a dense structure from forming. LTCC materials that are too low in glass content tend to have a higher surface roughness than materials with more glass and this surface roughness can cause problems for some applications. The presence of a nucleating agent in the inorganic composition may alleviate some of these potential problems.

It is also believed that the inclusion of a nucleating agent, such as titania, in the inorganic composition of the LTCC layer positively affects the viscosity and the porosity found between the layers of LTCC and the self-constraining layers (interfacial porosity). If too much nucleating agent is present, the result may be excessive interfacial porosity, allowing open channels to form. These open channels may decrease the mechanical strength of the structure and represent a severe reliability risk by allowing water to permeate the fired structure. A high porosity level may also cause delamination (100% porosity) of a multilayered structure into its component layers. In general, it is desirable to minimize the total volume fraction of porosity in the fired structure. It is also important that the porosity which is present is in the form of isolated bubbles rather than connected channels. It has been found that the inclusion of 7% titania in a particular LTCC inorganic composition allows a large amount of undesirable open interfacial porosity to form. When the amount of titania is decreased to about 5%, the interfacial porosity is reduced, but some regions of open pores remain. However, inclusion of only 2.7% titania in the LTCC layer reduces the interfacial porosity to a desirable level which eliminates the open porosity. Further reduction of the titania content further improves the density of the fired structure, but may also result in an undesirably high glass content in the fired LTCC layer.

Organic Binder

The final component of the low temperature ceramic layer is an organic binder in which the glass and ceramic particles are suspended, and which comprises a polymeric resin and a plasticizer and/or a dispersing agent. The components of the organic binder are decomposed and/or burnt off or volatized at temperatures of about 100 to about 500° C. The organic binder may be based on an industry standard LTCC formulation, such as described, for example, in U.S. Pat. Nos. 4,769,294; 5,387,474 and 4,536,535, or may be developed based on the particular inorganic composition of the green body tape and the desired application. Each of the components of the organic binder affects the specific characteristics of the tape, commonly known as green handling, which includes parameters such as carrier film release, binding efficiency, brittleness, robustness, etc. Selection and adjustment of these binder components is within the skill of the art.

For example, the shrinkage of the tape upon firing may be influenced by the choice of the polymeric resin. Typical polymeric resins include a large variety of polymeric materials, such as butyrals, cellulosic, silicone polymers, acrylate compounds, high molecular weight polyethers, acrylic polymers, co-polymers, and multi-polymers. Regardless of the nature of the polymer, it is desirable to use the minimum possible amount of organic binder in order to maximize the ratio of solids to organics, which improves particle packing and minimizes shrinkage upon firing. However, to avoid compromising tape handling properties, such as brittleness or green delamination (delamination of the green sheets prior to sintering), it is preferred to use up to about 20 weight % binder in about 80 weight % solids.

The second layer of the green body tape according to the present invention is referred to also as the "self-constraining layer." As used herein, the term "self-constraining" refers to the ability of the self-constraining layer to constrain one or more adjacent LTCC layers in the x-y directions during firing without the need for external constraints, such as external materials or physical constraints applied to the green body. As used herein, "external constraint" refers to any material, device, or force applied to the green body to achieve x-y plane constraint of the body layers, but which is removed after firing. The external constraint could conceivably be applied internally of the multilayered green body but does not remain as part of the monolithic structure after firing. In contrast, the self-constraining layer of the present invention remains as an integral part of the fired, monolithic, multilayer structure.

This self-constraining layer contains particles of a refractory ceramic, a wetting agent for the glass in the first layer, and an organic binder. The organic binder contains a polymeric resin and a plasticizer and/or dispersing agent as described previously, and may be the same as or different than the organic binder in the first layer. However, it is preferred that the organic binder in the self-constraining layer has the same composition as the organic binder in the low temperature ceramic layer used to form the green body tape. The organic binder in the self-constraining layer may also be a known formulation or may be one designed based on the inorganic composition of the self-constraining layer.

Refractory Ceramic

The refractory ceramic is a ceramic which will not sinter at a sintering temperature of the low temperature ceramic layer, typically about 750 to about 900° C. In essence, any high melting material would be appropriate, including high $T_g$ glasses or high temperature glass materials, both crystalline and non-crystalline, having softening points above about 1000° C., more preferably above about 1500° C. More particularly, the refractory ceramic preferably has a melting point of at least about 1.3 times the absolute (Kelvin) firing temperature. For example, preferred refractory ceramics which may be used in the self-constraining layer include inorganic oxides, metal silicates, metal carbides, metal bromides, metal nitrides, minerals and salts. Exemplary refractory ceramics include $Mg_xO_y$ (magnesia), $Be_xO_y$ (beryllia), $Al_xN_y$ (aluminum nitride), $B_xN_y$ (boron nitride), $BaO.Al_2O_3.2SiO$ (celsian), $CaO.Al_2O_3.2SiO_2$ (anorthite), $2MgO.SiO_2$ (forsterite), calcium borate, barium titanate, or $CaO.SiO_2$ (wollastonite). In these formulas, x and y represent relative proportions of the particular elements. Perovskites may be also used as the refractory ceramic in the present invention. The term "perovskite" will be understood by those skilled in the art to describe a family of inorganic oxides having the formula $ABO_3$, such as $CaTiO_3$, $BaTiO_3$, $SrTiO_3$, and $LaAlO_3$. The most preferred refractory ceramics are inorganic oxides, such as alumina, zirconia, titania, silica, anorthite, mullite, and derivatives thereof.

In a preferred embodiment, the refractory ceramic in the self-constraining layer of the green body tape and the ceramic in the LTCC layer are the same material, due to the desired material compatibility (such as thermal coefficient of expansion match) of the structure formed, as well as the chemical compatibility between the glass and the ceramic, such that no undesirable phases are formed by a reaction between the glass and the ceramic during the firing process.

Wetting Agent

The second component of the inorganic composition of the self-constraining layer of the green body tape is a wetting agent for the glass in the LTCC layer. The presence of the wetting agent promotes glass flow from the LTCC layer into the otherwise micro-porous self-constraining layer upon sintering of the green body tape to form a ceramic matrix. For example, silica, alkali metal oxides such as lithium oxide, sodium oxide, potassium oxide, and cesium oxides, and silicates (both alkali metal and alkaline earth metal) are preferred wetting agents for the present invention, lithium metasilicate ($Li_2SiO_3$) being the most preferred. However, the particular wetting agent for a specific green body tape may be selected based on the particular glass used in the first layer, and may be any wetting agent for glass which is known by those skilled in the art. In particular, it is preferred if the wetting agent is not dissolved by the first glass at temperatures typically used for firing the LTCC structures, typically about 850° C. to about 900° C. In the absence of a wetting agent, the glass may not sufficiently permeate into the self-constraining layer.

In the absence of a wetting agent, the self-constraining layer must be very thin (not more than about 20 microns) to avoid delamination of a multilayered tape into its component layers. By incorporating a wetting agent, such as lithium metasilicate, migration of the glass to the ceramic is increased and thicker layers may be prepared which do not delaminate. As will be explained below, thicker layers are more effective at minimizing x-y shrinkage upon sintering.

The confinement of excessive glass or movable floating glass and reduction of the amount of glass on the fired tape surface is an important aspect of the present invention. During sintering of traditional glass-ceramic LTCC tapes, not all of the glass particles of the tape react and crystallize. Rather, a percentage of the unreacted glass is left floating and consequently migrates toward the surface of the tape. The migration of glass or control of unreacted glass is particularly undesirable when co-firing surface metallization. During sintering, densification occurs in the metallic inorganic particles that compose the conductor traces and pads. If glass migrates and flows into the conductors, it will inhibit their ability to solder to surface-mount components. Furthermore, the electrical conductivity, by the presence of non-conductor glass phases in the metallization, is also compromised. The same principle applies to surface printed resistors, in which the resistivity fluctuates as glass migrates into the resistor during sintering. Therefore, it is desirable to prevent migration of glass to the outer layers of the tape.

Accordingly, due to the precision of the middle layer thickness in a three layer tape according to the present invention, control of excess glass migration into the tape surface may be achieved. This excess glass is contained in the middle of the tape in an amount controlled by the thickness of the middle layer, thus enabling the conductivity and resistivity of surface printed features to be significantly improved.

It is desirable to have high particle packing in the self-constraining layer of the green body tape. Particle packing, also known as packing density, refers to the volume fraction of solid particles, and is determined by particle size, shape and distribution. A wide range of refractory ceramic particle sizes is preferred. The presence of smaller particles improves compact strength, and thus greater interparticle contact improves the volume density in the self-constraining layer. Further, it is preferred to have at least 60 volume % solid irregularly shaped refractory particles in order to obtain maximum packing density.

In one embodiment, the self-constraining layer further comprises at least one glass, which may be any glass known to those skilled in the art. The glass functions as a wetting agent. Unlike the wetting agents previously described, the glass used in the self-constraining layer will dissolve into the glass used in the LTCC layer. Therefore, it is preferred if the glass has an average particle size about one-tenth of the average particle size of the refractory ceramic in the self-constraining layer, so that bulk of the glass can be forced into interstitial position between the large ceramic particles during lamination of the tape and thus minimize the shrinkage caused when the glass particles melt.

Figure 2:
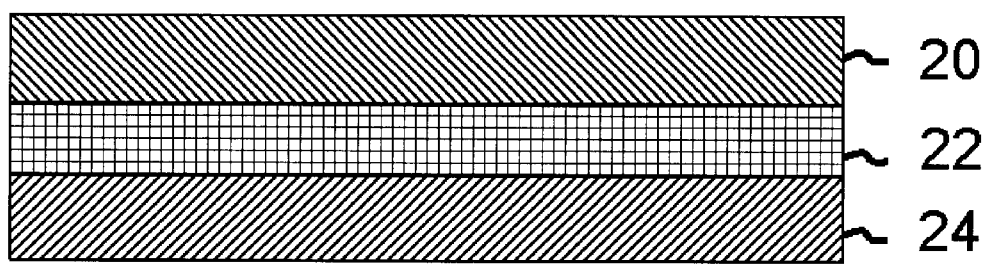
FIG. 2 is a schematic cross-sectional view of a three-layer tape according to the present invention.

In a preferred embodiment, the green body tape comprises one self-constraining layer sandwiched between two first low temperature ceramic or LTCC layers, as shown in FIG. 2. In such a three layer structure, the layers may be hereinafter referred to as top, middle, and bottom layers. The three layer structure shown in FIG. 2 contains a top low temperature ceramic layer 20, a middle self-constraining layer 22, and a bottom low temperature ceramic layer 24. In one embodiment, the top and bottom low temperature ceramic layers have substantially the same composition.

Figure 3:
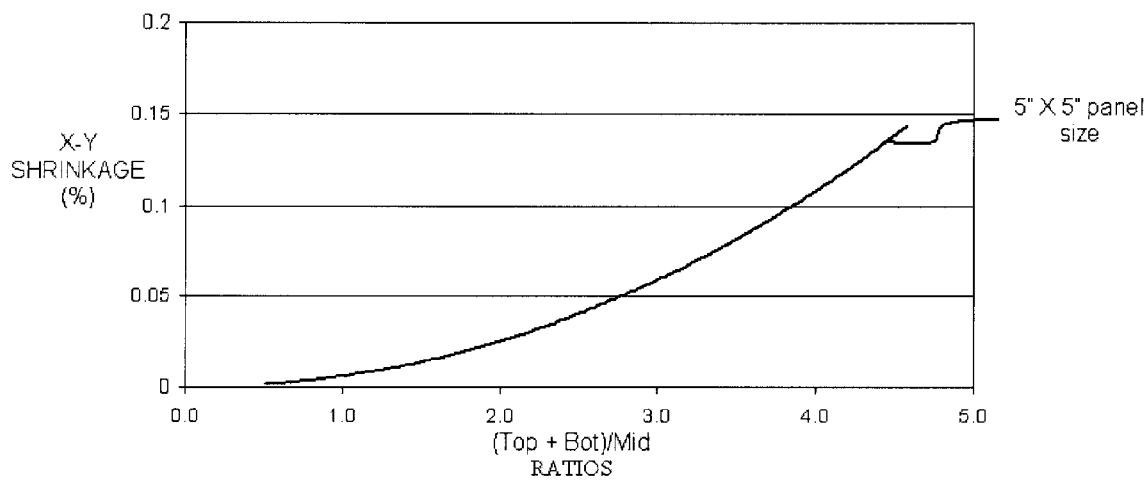
FIG. 3 is a graphical correlation of thickness ratio versus shrinkage control for a three-layer tape according to the present invention.

Preferably, the middle self-constraining layer has a thickness of greater than about 20 microns. The thickness of the middle layer has an important effect on the shrinkage of the green tape. FIG. 3 shows a graphical representation of the ratio of the thickness of the layers in a three layer green body tape versus x-y shrinkage for a panel size of 5 in by 5 in (approximately 12.7 cm×12.7 cm). It can be seen that as the thickness of the middle layer increases relative to the sum of the thicknesses of the top and bottom layers, the x-y shrinkage decreases. For example, in a 5.3 mil (135 micron) thick three layer tape, it has been found that a 12.5 micron thick middle self-constraining layer gives 0.5% shrinkage, whereas a 30 micron thick middle layer gives 0.17% shrinkage.

Upon firing the green body tape at the sintering temperature of the low temperature ceramic layer, such as about 750 to about 900° C., the layers of the tape densify in the z (thickness) direction, but shrinkage in the x-y planes of the layers is less than about 1%, and more preferably no more than about 0.2%.

While not wishing to be bound by theory, the low shrinkage in the x-y planes upon sintering may be explained as follows. During firing, after volatilization of the organic binders from the layers, the inorganic components in the LTCC layer(s) undergo sintering and start to densify, such that the viscosity of the glass particles decreases significantly and the particles begin to react chemically and crystallize (devitrify). Furthermore, there is an increase in grain size and a change in pore shape and size, typically resulting in the densification of the compacted particles. At the same time, due to the capillary force between the particles in the middle layer and the wetting force between the glass and the materials in the self-constraining layer, once the glass is sufficiently viscous, it will flow into the self-constraining layer. As a result of the preferred high packing density, the high solid content of the self-constraining layer, the inherent particle-to-particle contact, and the friction between the layers, the green body tape is forced to densify in the z direction only.

In order to achieve such low shrinkage levels, the particular components of the tape must be carefully selected to complement one another. For example, the glass in the LTCC layer(s) should meet the requirements of the dielectric, such as dielectric constant, hermeticity, sinterability, reactivity and crystallinity. Second, properties such as viscosity and wettability of the glass to the refractory ceramic are important. The wettability of the glass is dependent on the adhesion of the liquid-solid interface, the interface between the viscous glass and the refractory ceramic. Finally, the close packed porous structure of the refractory ceramic is important. As previously explained, the penetration of the glass into the close packed refractory ceramic in the self-constraining layer will be effected and may be controlled by the nature of the packing of the refractory ceramic.

In addition to the at least two layers in the green body tape, the tape may further comprise at least one electronic circuit component adhered to at least one outer planar surface of the tape, such as, but not limited to, a resistor, a capacitor, a varistor, a dielectric, a metal conductive pattern, or an inductive structure such as an inductor or transformer with or without a ferromagnetic or ferritic coring element. An inductive structure will be understood by those skilled in the art to describe a structure in which electronic current flowing through a conductor causes a magnetic field around the conductor, which results in a voltage that opposes the change in current (inductance). Other circuit features or passive components may also be used, such as wave guides, surface acoustic devices, resonators or mixers. Further, semi-conductor devices may be mounted onto the surface of the green body tape. It is also conceivable to apply electronic circuit components to one or more internal surfaces of the layers during production of the green body tape.

The preferred method for preparing the multilayer green body tape according to the present invention is the simultaneous wet on wet ceramic approach, in which the layers are applied through slot dies, as described below. However, any known method for forming tapes may be used. For example, the layers may be applied to a carrier with a wet on wet approach using doctor blades or any other slip depositing method, such as nozzle spraying. Although it may be possible to cast three layer wet tape almost sequentially with a fixture or sequentially using multiple doctor blades, there are disadvantages to tape casting techniques, as previously explained, including difficulty and often inaccurate control of middle layer thickness in multi-layer tape. In an alternative method, the layers may be formed and stacked either in wet or dry form, which may be expensive.

Because the green body tape according to the present invention is self-constrained, general methods known in the art for LTCC tape handling may be used for manufacturing structures therefrom without the need for additional constraining mechanisms. This novel green body tape thus minimizes production costs by tackling the source of dimensional uncertainty in ceramic substrates by eliminating many of the circuit development and manufacturing steps necessary to avoid dimensional errors and misregistration. Furthermore, the invention leaves the surfaces free from externally attached or laminated constraining material, allowing surface conductors to be co-fired along with the dielectric tape and thus reducing the number of firing cycles.

An appealing property of the green body tape according to the present invention relates to camber control and the planarity of a fired substrate upon co-firing of surface conductors. The term "camber" refers to the curvature of fired substrates out of the x-y plane, and is typically quantified by the largest deflection point in the z direction over a certain distance. Camber is caused by a sintering rate mismatch between the conductors and the dielectric tape. It is believed that during sintering of regular unconstrained tape, the sintering rate mismatch raises shearing stresses on the dielectric. These in-plane tensile stresses or forces cannot be counter reacted by the soft elastic tape during sintering, causing it to arch. Because of the close packing structure and solid composition of the middle or self-constraining layer of the green body tape according to the present invention, the inherent stiffness of the layer surpasses the sintering mismatch of the conductors and as a consequence, it is able to counteract the forces placed upon the tape. The glass in the low temperature ceramic layer which flows into the tape later reinforces this inherent strength.

Similar principles may be applied to show-through, which describes localized camber or curvature at the particular printed feature. Show-through is typically quantified by the maximum deflection over the feature distance. The self-constraining tape according to the present invention has proven to show virtually zero camber or show-through using a variety of silver pastes and different sintering rates.

As previously described, traditional constraining methods may result in undesirable properties of cavity-containing structures prepared from LTCC tapes for placing integrated circuits within. The use of self-constrained green body tapes according to the present invention overcomes these properties, such as necking. Specifically, with the self-constraining approach, the in-plane stresses or forces are localized and evenly distributed throughout the whole body of the structure, thus leaving near straight cavity and periphery walls. When constraining layers are evenly distributed from top to bottom in a structure prepared from multiple layers, the in-plane tensile stresses of sintering may be withstood. As the distribution of constraining layers increases in the module, the necking curvature is significantly minimized.

Monolithic Structure

In addition to the self-constrained green body tape, a dense, monolithic, low-temperature co-fired, self-constrained, multicomponent structure is also provided by the invention. The structure comprises a stack of at least two multilayer ceramic substrates, each substrate having at least one electronic circuit component mounted thereon or therein. These components may be, for example, resistors, capacitors, varistors, dielectrics, metal conductive patterns, or inductive structures, such as inductors or transformers with or without ferromagnetic or ferritic coring elements, as described previously. Each multilayer ceramic substrate comprises at least one low temperature ceramic layer containing sintered particles of a first ceramic and a first glass, and a self-constraining layer containing particles of a refractory ceramic and a wetting agent for the first glass. The ceramic, glass, refractory ceramic, and wetting agent for use in the multicomponent structure are as described previously. In a preferred embodiment, the ceramic in the first low temperature ceramic layer and the refractory ceramic in the self-constraining layer have the same composition. It is further preferred if the first low temperature ceramic layer further comprises a nucleating agent, such as titania, zirconia, anorthite, molybdenum oxide, tungsten oxide, or magnesium cobalt spinel, as previously described, which may be present in an amount effective to minimize porosity between the LTCC layer and the self-constraining layer.

The multicomponent structure may be formed by stacking the multilayered ceramic substrates, such as the green body tape previously described, and sintering the stack such that the refractory ceramic and the wetting agent in the self-constraining layer become partially fused with the glass and form a dense, monolithic structure. This structure is self-constrained because upon sintering the stack of multilayer ceramic substrates, the undesirable shrinkage in the x-y planes is less than about 1%, and less than about 0.2% in a preferred embodiment, yet no additional material or other external constraint is applied. As previously described, desirable shrinkage occurs in the z direction to densify the layers and yield a dense, monolithic structure.

Figure 4A:
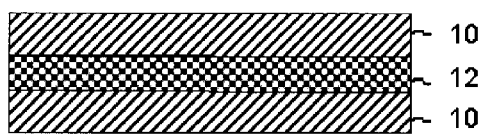
FIGS. 4A, B, C and D are schematic cross-sectional views of several self-constrained multicomponent structures according to the present invention.
Figure 4B:
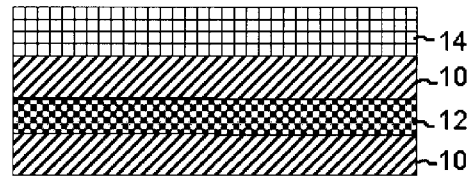
Figure 4C:
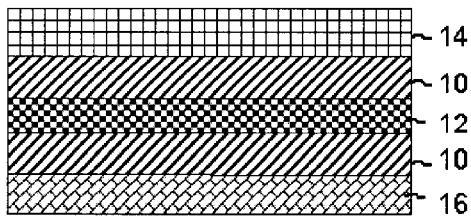
Figure 4D:
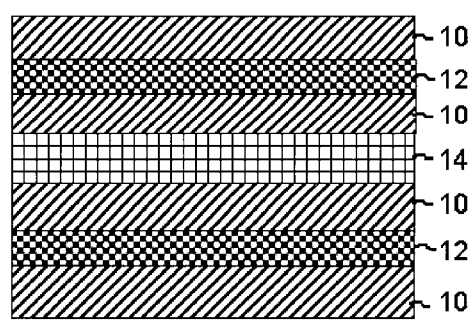

The monolithic structure may also comprise one self-constraining layer sandwiched between two first low temperature ceramic layers to create a three layer structure. As can be seen in FIG. 4A, such a three layer structure contains bottom and top layers 10, which are low temperature ceramic layers, and a middle self-constraining layer 12, which contains a refractory ceramic. As shown in FIG. 4B, it is also within the scope of the invention for the stack of layers to further comprise at least one further substrate 14 comprising a single layer containing sintered particles of a second ceramic and a second glass, which further substrate abuts at least one low temperature ceramic layer in the stack. The ceramic and the glass may be the same as or different from those in the low temperature ceramic layer. In one embodiment, the further substrate may be a traditional LTCC tape. In other possible configurations (FIG. 4C), the stack may comprise at least two further substrates 14 and 16, which may be the same or different, one being positioned at the top of the stack and one being positioned at the bottom of the stack. It is also possible for the further substrate 14 to be positioned between and abutting two multilayer substrates, as shown in FIG. 4D.

Such configurations may be referred to as "clad" structures, in which the use of multilayer substrates (such as, but not limited to the green body tapes according to the invention) are stacked with traditional LTCC tapes and co-fired to prevent the stack from shrinking in the x-y planes upon sintering. These clad structures would enable a user to select a particular, commercially available LTCC tape based on a desired application, and self-constrain the tape to form a structure without the need for external constraining techniques or their associated disadvantages as previously described.

Method of Making Green Body Tape

This invention also provides a method of fabricating a monolithic, multilayer green body tape which solves the problems previously discussed with traditional manufacturing methods. Such tapes may be used for the construction of multilayered microelectronic circuit modules. The method comprises forming a first slurry comprising particles of a first ceramic, a first glass, a first organic binder, and first solvent; and a second slurry comprising particles of a refractory ceramic, a second organic binder, and a second solvent. The ceramic, glass, organic binders and refractory ceramic are as previously described; the organic binders in the first and second slurries may be the same or different and may be selected based on the particular components of the respective slurries. However, it is preferred if the organic binder in the first slurry and the organic binder in the second binder have the same composition. The solvent may be any fast-evaporating (high vapor pressure) solvent known in the art which is capable of dissolving the binder resins, including alcohols, such as methanol, ethanol, or butanol, ketones, such as methyl isobutyl ketone or methyl ethyl ketone, or other solvents such as, but not limited to, cyclohexanone toluene ethers or glycol ethers, acetates of glycol ethers, or blends of these solvents in which the relative proportions of component solvents in the blends may be adjusted to control or moderate the evaporation rate.

In a preferred embodiment, the second slurry further comprises a wetting agent for the first glass, as previously described, such as silica, an alkali metal oxide such as lithium oxide, sodium oxide, potassium oxide, or cesium oxide, or a silicate (alkali metal or alkaline earth metal), lithium metasilicate being the most preferred. The second slurry may further comprise at least one glass, as explained previously. Additionally, the first slurry may further comprise a nucleating agent, such as titania, zirconia, anorthite, molybdenum oxide, tungsten oxide, or magnesium cobalt spinel, as previously described. In a preferred embodiment, the ceramic in the first slurry and the refractive ceramic in the second slurry are the same.

The method further comprises depositing a first layer of one of the slurries through a slot-die onto a carrier and depositing a second layer of the other slurry through a slot die onto the first layer while the slurry in the first layer is still in a wet condition, but such that the first and second layers remain substantially discrete. The carrier may be an organic carrier film, such as polyester film, or any other appropriate carrier known in the art. Finally, the method comprises drying the deposited slurries to substantially remove the solvents but not the binders, after which the dried tape may be spooled onto a roll, if desired. The tape is preferably dried using a combination of high air flow to remove the solvent(s) before it saturates the atmosphere over the tape, and radiant heaters, which gradually raise the temperature of the tape to about 80° C. However, any method of drying known in the art may be employed in the method of the invention. In a preferred embodiment, the deposition of the two layers is carried out substantially simultaneously.

In one embodiment, the method further comprises forming a third slurry comprising particles of a second ceramic, a second glass, a third organic binder, and a third solvent. In a preferred embodiment, the first slurry and the third slurry have substantially the same composition, but the components of the third slurry may be selected independently of the composition of the first slurry. The method further comprises depositing a third layer of the third slurry through a slot-die onto the second layer of the second slurry while the second slurry is still in a wet condition, but such that the second and third layers remain substantially discrete. Preferably, all three layers are deposited substantially simultaneously. In one embodiment, the first (or first and third) slurries comprise the components of traditional LTCC tapes, and the invention thus provides an improved method for forming a self-constrained multilayer tape which maintains the properties of traditional LTCC tape.

Figure 5:
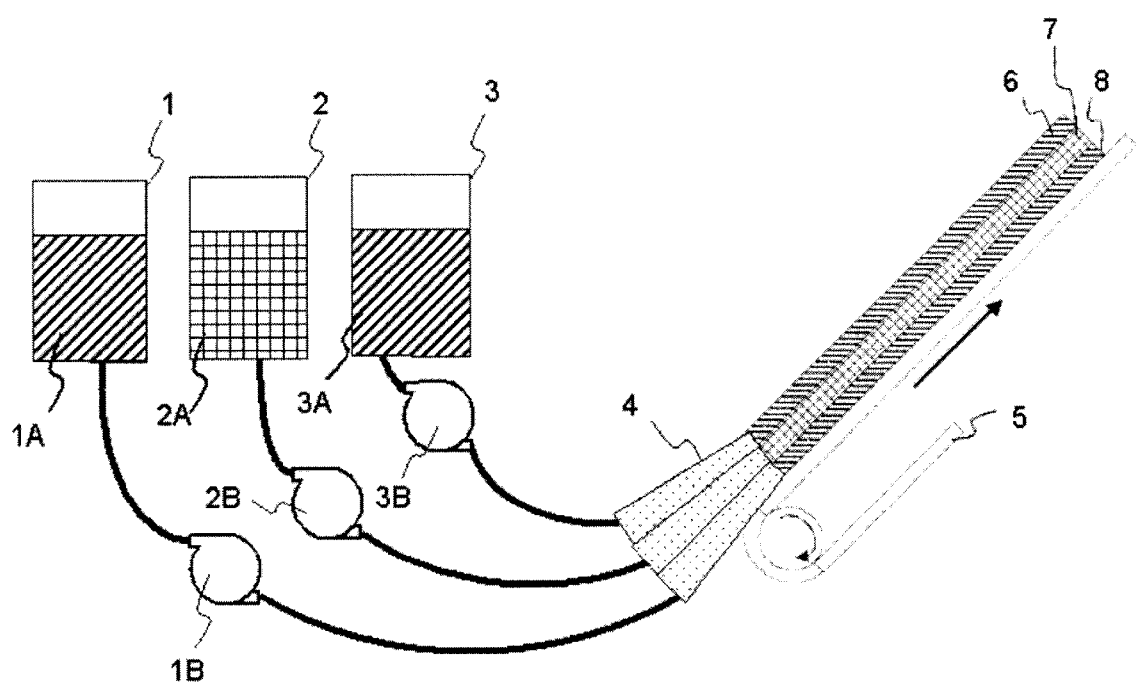
FIG. 5 is a schematic diagram of a wet on wet ceramic simultaneous deposition system according to the present invention.

A better understanding of a preferred embodiment of the method for forming a monolithic, three layer green body tape, which may be referred to as a "wet on wet ceramic approach," may be achieved by referring to FIG. 5. The wet on wet ceramic approach is a modification of regular die-casting techniques, in which wet ceramic is injected through a slot-die and deposited onto a polyester film. The ceramic slurries 1A, 2A and 3A are deposited and sealed in separate tanks 1, 2 and 3. Slurries 1A and 3A preferably have substantially the same compositions, but may also have different compositions. Slurry 2A, which contains the refractory ceramic, forms the middle self-constraining layer. Each of slurries 1A, 2A, and 3A contains a mixture of the inorganic composition, the organic binder, and solvent(s). The tanks feed respectively through separate pumps and into three separate slot-dies that are arranged adjacent to one other in a particular configuration. The three ceramic slurries are discharged simultaneously onto the moving carrier film 5. Although the carrier film 5 in FIG. 5 is depicted as moving upwardly at an approximately 45° angle with respect to horizontal, it is also possible for the film to move at a different angle, horizontally, or even vertically.

As shown in FIG. 5, the bottom layer slurry 1A is fed through pump 1B into the bottom of the slot-die configuration 4 and deposited at the bottom position adjacent to the film 5, forming a first layer 8 on the film 5. The middle layer slurry 2A is fed through pump 2B into the middle of the slot-die configuration 4 and deposited onto the first layer 8 on the carrier film 5. The slurry 2A thus forms a middle layer 7 on the carrier film 5. Finally, the top layer slurry 3A is fed through pump 3B into the top of the slot-die configuration 4 and deposited onto the middle layer 7 on the carrier film 5. The slurry 3A is deposited to form a top layer 6 on the carrier film 5. It should be understood that these slurries are deposited substantially simultaneously in a manner similar to co-extrusion.

Using such an approach, the surface tension between the carrier film and the viscous fluid slurry creates a meniscus at the die-film interface, allowing the ceramic slurry to be carried along as the tape moves at a specific velocity. Due to the high viscosity of the individual slurries, no intermixing is encountered, and the three ceramic slurries may be deposited substantially simultaneously. The preferred slurry viscosity is about 3000±500 centerpoise (cps). The velocity of the carrier film is dependent on the drying parameters of the composite tape: the thicker the tape, the slower the carrier must move in order to allow proper drying to occur. By maintaining a constant carrier speed, the desired thickness of the individual layers is achieved by adjusting the pump pressure individually for each tank, which is further controlled by the angular velocity of the pumps in RPM.

Although this description relates to a preferred embodiment of the present invention, it may be understood that variations are possible and could be determined by one skilled in the art by routine experimentation. For example, the wet slurry viscosity may be varied between about 500 and 600 cps. Alternatively, the type of pump and pressure may be varied, as may the positions of the slot-dies, such as separate, two dies together, or more than three together.

Following the drying of the film containing the deposited layers using a combination of heat and airflow as previously described, the method may further comprise adhering at least one electronic circuit component to at least one outer planar surface of the green body tape. The component may be one as previously described.

The method according to the present invention may be used to produce a self-constrained tape in which the middle layer (formed from the second slurry) has a thickness of greater than 20 microns. As previously explained, the thickness of the center layer is important for controlling the amount of x-y shrinkage of the tape upon ultimate sintering.

Finally, this invention provides an improvement for the method of producing a monolithic structure for a multilayer electronic circuit or hydraulic module. A hydraulic module contains channels and/or cavities formed in the structure to enable the flow of fluids through the structure either for cooling power devices or for structures having valves and pumps formed in the tape. These channels and/or cavities are formed by placing structures formed from organic materials, such as wax or polyethylene, with the desired shape in the tape prior to the lamination step. These added structures disappear when the organic binder is burned out, leaving an open channel and/or cavity which remains after firing.

The traditional method for producing such a monolithic structure comprises the steps of providing green body ceramic tapes having x-y planes, applying electronic circuit components to the tapes, stacking the tapes in a z-direction, laminating the stacked tapes, heating the laminate of stacked tapes to remove organic binder from the tapes, and co-firing the binderless laminate to produce a monolithic structure with shrinkage substantially only in the z-direction and substantially no shrinkage in the x-y planes. This traditional method requires the application to the stack of an external constraint, such as clamping pressure or sacrificial layers. The improvement according to the invention involves providing a green body tape with a self-constraining layer, and co-firing without application of an external constraint. At least one of the green body ceramic tapes forming the laminated stack preferably comprises a low temperature ceramic layer comprising particles of a first ceramic, a first glass, and first organic binder. The self-constraining layer preferably comprises particles of a refractory ceramic, a wetting agent for the first glass in the tape, and a second organic binder. These components of the tape and of the self-constraining layer are as described previously. As previously described, it is preferred that the low temperature ceramic layer comprise a nucleating agent, that the ceramic in the low temperature ceramic layer and the refractory ceramic in the self-constraining layer are the same, and that the self-constraining layer further comprises a glass.

In contrast with traditional methods of constrained sintering in which external constraints, such as pressure or sacrificial layers, must be included in the tape, the present improvement, which utilizes a self-constrained layer, reduces shrinkage in the x-y planes to less than about 1% and preferably less than about 0.2% without the need for such external physical or material constraints.

The present invention can be better understood from the following specific, non-limiting examples.

EXAMPLE 1

A three-layer tape containing identical top and bottom (outer) low temperature ceramic layers and middle self-constraining layers were prepared as follows. To make the outer layers, 336.65 lbs of a slurry were prepared by combining the first eight components shown in Table 1 in a water-cooled media mill (commercially available from Premier Mills) containing alumina disks on a rotating shaft and zirconia pellets as a medium to aid in mixing. The resulting mixture was milled for 9.9 hours. The final two components were then added to the mixture in one-third increments and mixed after each addition until the newly added materials were no longer visible on the top surface. After the addition was complete, mixing was continued for two additional hours to yield a homogeneous slurry having a viscosity of 3620 cps, determined using a Brookfield Viscometer with a #5 spindle operating at 20 rpm. The slurry was then evenly split and pumped into two separate tanks.

TABLE 1

Composition of Slurry for Outer Layers

| Component | Weight Percentage |
|---|---|
| methyl ethyl ketone (solvent) | 8.13 |
| ethanol (solvent) | 7.60 |
| $Al_2O_3$ | 29.26 |
| glass | 32.81 |
| $TiO_2$ | 1.75 |
| blue pigment | 0.29 |
| dispersant | 1.98 |
| lubricant | 2.10 |
| pre-made mixture of binder, plasticizer, and MEK | 16.08 |

A slurry for the middle self-constraining layer was similarly prepared by mixing the components listed in Table 2 using a media mill to produce 168 pounds of slurry. Following addition of the first six components, milling was performed for 5 hours. The last two components were added as previously described, mixed for an additional two hours, and pumped into a third tank. The viscosity of the slurry was measured as described above to be 1500 cps.

TABLE 2

Composition of Slurry for Inner Layer

| Component | Weight Percentage |
|---|---|
| $Al_2O_3$ | 56.98 |
| $Li_2SiO_3$ | 7.12 |
| methyl ethyl ketone (solvent) | 8.83 |
| ethanol (solvent) | 7.70 |
| dispersant A | 1.05 |
| lubricant | 1.20 |
| dispersant B | 1.05 |
| pre-made mixture of binder, plasticizer, and MEK | 16.07 |

The slurries in the three tanks were then pumped into two separate slot dies arranged adjacent to one another, and discharged simultaneously onto a 1.4 mil thick Mylar™ polyester film (commercially available from DuPont) moving vertically at a speed of 10 feet/minute. One slot die was used to deposit the slurries which formed the bottom low temperature ceramic and middle self-constraining ceramic layers, and the second slot die deposited the top low temperature ceramic layer.

The tape containing the three slurry layers was then dried by passing it sequentially through four heating chambers at different temperatures and air flows: 48.8° C. (500 cfm), 54.4° C. (500 cfm), 54.4° C. (3000 cfm), and 76.7° C. (2000 cfm). After drying, the thicknesses of the top, middle, and bottom layers were determined to be about 2.3 mils, about 1.6 mils, and about 2.3 mils, respectively.

The resulting tape was then cut into 5"×5" segments and four segments were stacked together and laminated at 70° C. at a pressure of 4,000 psi for 15 minutes. The stack was then sintered using the following profile. The temperature was ramped from ambient to 450° C. at a rate of 1° C./minute to remove the organic components, then increased to 870° C. at 7.5° C./minute. After holding the temperature steady at 870° C. for 30 minutes, the temperature was cooled to ambient temperature at a rate of 10° C./minute. Following sintering, the shrinkage of the tape in the x-y directions was found to be 0.154±0.0049% and 0.138±0.0133%, respectively.

EXAMPLES 2–6

In order to investigate the ability to constrain low temperature ceramic tapes having different compositions, five three-layer tapes were prepared in which the top and bottom layers were commercially available LTCC tapes having the compositions shown in Table 3. For each tape, the glass/ceramic component contained various glasses, fillers, and nucleating agents as shown in Table 3. The physical properties of each LTCC tape are listed in Table 5.

To prepare each middle self-constraining layer, a slurry containing the organic and inorganic components listed in Table 4 in a solids/organic ratio of 64.1% was prepared by ball milling for 24 hours using alumina as the media. The slurry was tape cast using a doctor blade onto a 1.4 mil thick Mylar™ polyester film (commercially available from DuPont) to form a 1.6 mil thick layer.

To form the three-layer tape, a stack was made in which a self-constraining layer was sandwiched between two identical LTCC layers. The resulting stack was heated at 70° C. at a pressure of 40,000 psi for 15 minutes to form a three-layer green body tape. The tape was then sintered using the temperature profile described in Example 1 and measured to determine the x-y shrinkage.

As can be seen by the data in Table 5, the x-y shrinkage for all five three-layer tapes according to the present invention was not more than about 0.2%, and in one case was only 0.12%. This shrinkage is dramatically lower than the shrinkage for the unconstrained LTCC tapes. Furthermore, it can be seen that by preparing an appropriate middle self-constraining layer, it is possible to constrain a variety of different types of commercially available LTCC tapes.

TABLE 3

Components of LTCC Tapes

| | TAPE 1 | TAPE 2 | TAPE 3 | TAPE 4 | TAPE 5 |
|---|---|---|---|---|---|
| Casting Solution Composition | | | | | |
| Glass/Ceramic Mixture[a] | 65.3 | 57.97 | 65.34 | 47.1 | 36.00 + 24.00[b] |
| Acrylic polymer | 7.0 | — | 6.97 | 4.8 | — |
| Butyral Resin | — | 3.96 | — | — | — |
| Methyl Ethyl Ketone | 15.4 | — | 15.40 | 3.1 | — |
| Dioctyl Phthalate | 1.4 | — | 1.38 | 1.8 | — |
| Methyl Isobutyl Ketone | — | 27.51 | — | — | — |
| Isopropanol | — | — | — | 2.4 | — |
| Methylene Chloride | — | — | — | 2.8 | — |
| Freon | — | — | — | 4.2 | — |
| Trichloroethylene | — | — | — | 33.8 | — |
| Surfactant | 2.0 | — | 2.03 | — | x |
| Plasticizer | 1.1 | 1.39 | — | — | x |
| Methanol | — | 9.17 | 7.82 | — | — |
| Dialkylene glycol | — | — | 1.06 | — | — |
| Solvent | — | — | — | — | x |
| Binder | — | — | — | — | x |
| Ethanol | 7.8 | — | — | — | — |
| Glass/Ceramic Components[a] | | | | | |
| $SiO_2$ | x | x | x | x | x |
| BaO | x | x | x | x | |
| $Al_2O_3$ | | x | x | x | |
| $B_2O_3$ | x | x | x | x | x |
| CaO | x | x | x | x | x |
| SrO | x | x | x | | |
| MgO | | x | | x | |
| $K_2O$ | x | x | | | x |
| PbO | | x | | x | |
| ZnO | | | | x | |
| $Li_2O$ | | | | | x |
| $Na_2O$ | | | | | x |
| Fillers/Nucleating Agent[a] | | | | | |
| $Al_2O_3$ A | x | x | | | |
| $Al_2O_3$ B | x | | x | | |
| $TiO_2$ | x | x | x | | |
| Mullite | | | | x | |
| $Cu_2O$ | | | | | |
| $SiO_2$ | | x | x | | |
| $CaB_2O_4$ | | | | | x |

[a]Glass/Ceramic mixture contains both glass/ceramic components and fillers/nucleating agents as shown
[b]Tape 5 contains both a crystalline glass and an amorphous glass

TABLE 4

Slurry Components of Self-Constraining Layers

| | TAPE 1 | TAPE 2 | TAPE 3 | TAPE 4 | TAPE 5 |
|---|---|---|---|---|---|
| Organic Components (relative ratios) | | | | | |
| Acrylic polymer | 7.0 | 7.0 | 7.0 | 7.0 | 7.0 |
| Butyral Resin | — | — | — | — | — |
| Methyl Ethyl Ketone | 15.4 | 15.4 | 15.4 | 15.4 | 15.4 |
| Dioctyl Phthalate | 1.4 | 1.4 | 1.4 | 1.4 | 1.4 |
| Surfactant | 2.0 | 2.0 | 2.0 | 2.0 | 2.0 |
| Plasticizer | 1.1 | 1.1 | 1.1 | 1.1 | 1.1 |
| Ethanol | 7.8 | 7.8 | 7.8 | 7.8 | 7.8 |
| Inorganic Components (relative ratios) | | | | | |
| $Al_2O_3$ | 90.0 | 60.5 | 60.5 | 60.5 | 90.0 |
| $Li_2O_3$ | 10.0 | 27.5 | 27.5 | 27.5 | 10.0 |
| Glass | — | 10 | 10 | 10 | — |

TABLE 5

Properties of LTCC Tape and Tri-Layer Tape

|  | TAPE 1 | TAPE 2 | TAPE 3 | TAPE 4 | TAPE 5 |
|---|---|---|---|---|---|
| LTCC Tape Properties |  |  |  |  |  |
| TCE (ppm/° C.) | 5.6 | 6.7 | 6.8 | 6.0 | 7.0 |
| X-Y Shrinkage | 14% | 14.40% | 14.40% | 13% | 15% |
| Tri-layer Tape X-Y Shrinkage | 0.12% | 0.20% | 0.20% | 0.19% | 0.23% |

There are several important differences between traditional sacrificial constraint methods and a monolithic constraint method according to the present invention. For example, in sacrificial methods, the constraining material is removed after firing, whereas in monolithic methods it becomes part of the final structure. In sacrificial methods, the constraining material has no tensile strength after firing, while the constraining material used in monolithic methods has mechanical properties similar to the LTCC tape around it after firing. Further, in sacrificial constraint, the glass diffusion into the constraining material is minimized, whereas in monolithic methods, the glass penetration is saturated. Additionally, a sacrificial constraining material is always external to the final circuit body, while in monolithic methods, the constraining material is internal to the circuit. Finally, in sacrificial methods, the constraining material is sintered at a temperature significantly higher than the firing temperature of the LTCC. In contrast, the constraining material used in monolithic methods is fused at a temperature below the firing temperature and becomes an integral part of the final structure after firing.

These differences, among others, result in a variety of advantages of the monolithic constraint method according to the present invention relative to traditional methods of sintering. Specifically, in comparison with conventional free sintering of a uniform LTCC tape, the monolithic constraint approach has at least two advantages. First, the x-y shrinkage can be reduced from conventional shrinkage levels of about 10% to 15% down to less than about 1%, and even less than about 0.2%. Second, the variation in the x-y shrinkage can be reduced from about 0.2% to 0.4% to less than about 0.1%.

Relative to mechanically constrained sintering, the monolithic constraint approach has the advantage that it eliminates the need for placing appropriately patterned platens over each individual part in a firing batch.

Finally, in comparison with constrained sintering using a sacrificial constraint layer, the monolithic constraint approach is advantageous because the constraining material does not need to be removed after firing, and conductors and resistors can be co-fired on the surface of the monolithically constrained LTCC tape. Additionally, rather than constrain the circuit only at the surface LTCC body, the monolithically constrained material supports the structure uniformly throughout the thickness of the part, allowing for the formation of greater part thickness and novel structures.

The self-constrained green body tape according to the present invention may be applicable to a wide variety of applications which use constrained sintered parts, and may be applicable for any application which relates to building circuits in multilayered ceramic structures. Because there is no mismatching of the layers, this technology is especially important for steps subsequent to ceramic structure formation. Uses may include diverse applications, such as in the biomedical field in electromechanical devices, to create shrink-free meso-structures, and in sensor applications.

This invention thus provides a green body tape and methods for its use and production which is more economical in by-passing many of the sources of dimensional uncertainty in ceramic parts and by eliminating many of the circuit development and manufacturing steps necessary to avoid dimensional errors and misregistration. The non-shrinkable tape according to the present invention has a material structure which is especially designed so as to inhibit internal shrinkage in two dimensions, x and y.

The materials according to the present invention have a number of advantages, including no mechanical compromise from unsintered particles, so no delamination will occur; no sacrificial material to be removed; controlled porosity and compatibility with co-fired conductors; the possibility to create thick stacks of green body tapes according to the present invention; and the possibility for good surface adhesion if the material is buried. The invention thus provides materials and methods with numerous advantages, and with none of the drawbacks and shortcoming of known methods and materials.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A monolithic green body tape having an x-y plane and a thickness in a z-direction for use in low temperature ceramic co-firing, comprising:
   at least one low temperature ceramic layer containing particles of a first ceramic, a first glass, and a first organic binder; and
   at least one self-constraining layer containing particles of a refractory ceramic, a wetting agent for the first glass, and a second organic binder;
   wherein the refractory ceramic will not sinter at a sintering temperature of the low temperature ceramic layer, such that upon firing of the green body tape at the sintering temperature of the low temperature ceramic, the layers densify in the z direction but shrinkage in the x-y plane is less than about 1% without application of an external constraint.

2. The tape according to claim 1, wherein the green body tape comprises one self-constraining layer sandwiched between two low temperature ceramic layers.

3. The tape according to claim 2, wherein the two low temperature ceramic layers have substantially the same composition.

4. The tape according to claim 2, wherein the at least one self-constraining layer has a thickness of greater than about 20 microns.

5. The tape according to claim 1, further comprising at least one electronic circuit component adhered to at least one outer planar surface of the green body tape.

6. The tape according to claim 5, wherein the at least one component is selected from the group consisting of a resistor, a capacitor, a varistor, a dielectric, an inductive structure, and a metal conductive pattern.

7. The tape according to claim 1, wherein the refractory ceramic is selected from the group consisting of an inorganic oxide, a metal silicate, a metal carbide, a metal bromide, a metal nitride, and a mineral.

8. The tape according to claim 7, wherein the inorganic oxide is selected from the group consisting of alumina, zirconia, titania, anorthite, mullite, perovskite, and silica.

9. The tape according to claim 1, wherein at least one of the first organic binder and the second organic binder comprises a polymeric resin and at least one selected from the group consisting of a plasticizer and a dispersing agent.

10. The tape according to claim 1, wherein the wetting agent for the first glass is selected from the group consisting of silica, a metal oxide, and a silicate.

11. The tape according to claim 10, wherein the wetting agent for the first glass comprises lithium metasilicate.

12. The tape according to claim 1, wherein the shrinkage in the x-y plane upon firing the green body tape is not more than about 0.2%.

13. The tape according to claim 1, wherein the at least one self-constraining layer further comprises at least one glass.

14. The tape according to claim 1, wherein the first ceramic and the refractory ceramic comprises the same material.

15. The tape according to claim 1, wherein the at least one low temperature ceramic layer further comprises a nucleating agent.

16. The tape according to claim 15, wherein the nucleating agent is selected from the group consisting of titania, zirconia, anorthite, molybdenum oxide, tungsten oxide, and magnesium cobalt spinel.

17. A dense, monolithic, low temperature co-fired, self-constrained multicomponent structure comprising a stack of at least two multilayer ceramic substrates; each substrate having at least one electronic circuit component mounted thereon or therein; each substrate comprising at least one low temperature ceramic layer containing sintered particles of a first ceramic and a first glass; and at least one self-constraining layer containing particles of a refractory ceramic and a wetting agent for the first glass, wherein the refractory ceramic and the wetting agent are at least partially fused with the first glass.

18. The structure according to claim 17, wherein each substrate comprises one self-constraining layer sandwiched between two low temperature ceramic layers.

19. The structure according to claim 17, wherein the stack further comprises at least one further substrate comprising a single layer containing sintered particles of a second ceramic and a second glass, said further substrate abutting at least one low temperature ceramic layer.

20. The structure according to claim 19, wherein the stack further comprises at least two further substrates, one being positioned on the top of the stack and one being positioned on the bottom of the stack.

21. The structure according to claim 19, wherein the at least one further substrate is positioned between and abutting two of the multilayer substrates.

22. The structure according to claim 17, wherein the at least one low temperature ceramic layer further comprises a nucleating agent in an amount effective to minimize porosity between the at least one low temperature ceramic layer and the at least one self-constraining layer.

23. The structure according to claim 22, wherein the nucleating agent is selected from the group consisting of titania, zirconia, anorthite, molybdenum oxide, tungsten oxide, and magnesium cobalt spinel.

24. The structure according to claim 17, wherein the first ceramic and the refractory ceramic comprises the same material.

25. The structure according to claim 17, wherein the at least one electronic circuit component is selected from the group consisting of a resistor, a capacitor, a varistor, a dielectric, an inductive structure, and a metal conductive pattern.

* * * * *